(12) United States Patent
Sugahara

(10) Patent No.: US 6,613,461 B1
(45) Date of Patent: Sep. 2, 2003

(54) GALLIUM NITRIDE-BASED COMPOUND SEMICONDUCTOR CHIP AND METHOD FOR PRODUCING THE SAME, AND GALLIUM NITRIDE-BASED COMPOUND SEMICONDUCTOR WAFER

(75) Inventor: Satoshi Sugahara, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 117 days.

(21) Appl. No.: 09/675,813

(22) Filed: Sep. 28, 2000

(30) Foreign Application Priority Data

Sep. 30, 1999 (JP) ............. 11-278032
Sep. 27, 2000 (JP) ............. 2000-295220

(51) Int. Cl.⁷ ............................... C30B 29/38
(52) U.S. Cl. .................. 428/698; 428/141; 428/332; 117/952
(58) Field of Search .................. 428/698, 141, 428/195, 163, 332; 117/952; 257/86, 94, 95, 103, 618

(56) References Cited

U.S. PATENT DOCUMENTS 5,275,958 A * 1/1994 Ishikawa .......... 148/DIG. 135
5,909,036 A * 6/1999 Tanaka et al. ............ 257/103
5,985,687 A * 11/1999 Bowers et al. ............. 438/29
6,072,197 A * 6/2000 Horino et al. ............. 257/103
6,335,546 B1 * 1/2002 Tsuda et al. ............... 257/94
6,447,604 B1 * 9/2002 Flynn et al. ................ 117/89

FOREIGN PATENT DOCUMENTS

JP            7-94784         4/1995
JP        410190059 A    *  7/1998

OTHER PUBLICATIONS

Rapceiwcz, K et al. Theory of surface morphology of wurtzite GaN (0001) surfaces. The American Physical Society, Physical Review B, vol. 56, No. 20, 1997, No month.*

* cited by examiner

Primary Examiner—Deborah Jones
Assistant Examiner—Stephen Stein
(74) Attorney, Agent, or Firm—Morrison & Foerster LLP

(57) ABSTRACT

A gallium nitride-based compound semiconductor chip comprises a gallium nitride substrate having a (0001) facet of a wurtzite type crystal structure as a principal facet and a gallium nitride-based compound semiconductor crystal formed on the gallium nitride substrate, wherein: the gallium nitride-based compound semiconductor chip has a plurality of division facets and at least one of the plurality of division facets of the gallium nitride-based compound semiconductor chip is in a cleave facet direction of the gallium nitride substrate.

16 Claims, 13 Drawing Sheets

GALLIUM NITRIDE-BASED COMPOUND SEMICONDUCTOR CHIP AND METHOD FOR PRODUCING THE SAME, AND GALLIUM NITRIDE-BASED COMPOUND SEMICONDUCTOR WAFER

BACKGROUND OF THE INVENTION

1. Field of the Invention

The present invention relates to a gallium nitride-based compound semiconductor chip produced by growing a gallium nitride-based compound semiconductor crystal on a gallium nitride substrate with a wurtzite type crystal structure and dividing the resulting wafer, a method for producing such a chip, and a gallium nitride-based compound semiconductor wafer.

2. Description of the Related Art

A light emitting device using a gallium nitride-based compound semiconductor is capable of emitting light with wavelengths widely ranging from blue to orange by adjusting a composition of each of the compound semiconductor layers therein. Such gallium nitride-based compound semiconductor light emitting devices have been conventionally produced by growing a gallium nitride-based compound semiconductor film on a sapphire substrate, the crystal structure of which is a rhombohedral structure, by using a metal organic chemical vapor deposition method or the like. However, a gallium nitride-based compound semiconductor crystal formed on a sapphire substrate is poor in quality because a lattice incommensurate between the sapphire substrate and the gallium nitride-based compound semiconductor crystal is significant. Therefore, a high light emission efficiency cannot be achieved. This is why attempts are being made to produce a light emitting device by producing a gallium nitride substrate and growing a gallium nitride-based compound semiconductor thereupon. However, the gallium nitride substrate has a crystal structure which is a wurtzite type structure, unlike the sapphire substrate which has a rhombohedral structure. No methods have been devised for producing a wafer by growing the gallium nitride-based compound semiconductor crystal on the gallium nitride substrate having the wurtzite type structure and forming an electrode thereon, and dividing the wafer into chips.

In a wafer produced by growing a gallium nitride-based compound semiconductor crystal on a gallium nitride substrate having a wurtzite type structure, there is no lattice incommensurate between the gallium nitride substrate and the gallium nitride-based compound semiconductor crystal. Therefore, the quality of the gallium nitride-based compound semiconductor crystal in such a wafer is satisfactory. However, with regard to producing a wafer by growing a gallium nitride-based compound semiconductor crystal on a gallium nitride substrate having a wurtzite type crystal structure and forming an electrode thereon, and dividing the wafer into gallium nitride-based compound semiconductor chips are light emitting devices, no reports have been made in relation to the following: (1) what an approximate thickness of the wafer should be and what a division facet direction of the wafer should be in order to produce satisfactory chips with no defects in the shape, such as nicks or the like; (2) how grooves for assisting chip division should be formed; and (3) how the chip division should be made.

SUMMARY OF THE INVENTION

The inventors of the present invention examined a technique in the chip division of a wafer produced by growing a gallium nitride-based compound semiconductor crystal on a gallium nitride substrate having a (0001) facet of a wurtzite type crystal structure as a principal facet. Such a technique has never been put into practice. A method has been found for producing a gallium nitride-based compound semiconductor chip as a light emitting device of a satisfactory shape without nicks or the like at a high yield, and the structure of the gallium nitride-based compound semiconductor chip also has been disclosed.

A nitride semiconductor light emitting chip is a gallium nitride-based compound semiconductor chip including a gallium nitride substrate with a (0001) facet of a wurtzite type crystal structure as a principal facet, and a gallium nitride-based compound semiconductor crystal grown on the gallium nitride substrate. The gallium nitride-based compound semiconductor chip is characterized in that at least one of the division facets thereof is a cleave facet of the gallium nitride substrate.

Cleave facets of the wurtzite type crystal in directions can be deviated by 60 degrees from one another. Division is relatively easy in the cleave facet direction, while division is difficult in a direction substantially perpendicular to the cleave facet. The ease of division in such a substantially perpendicular direction is different from that in the cleave facet direction, thereby causing defects in the shape of the chips, such as nicks or the like. The present invention decreases the number of defects in the shape of the chips, such as nicks or the like. Therefore, chips having satisfactory cross-sectional portions can be produced at a high yield.

The thickness of the gallium nitride substrate may be in the range between 50 $\mu$m or more and 250 $\mu$m or less. When the thickness of the gallium nitride-substrate is greater than 250 $\mu$m, the number of the chips having defects in the shape, such as nicks or the like, increases in the chip division step because the gallium nitride substrate is relatively hard. When the thickness of the wafer is smaller than 50 $\mu$m, the wafer becomes easy to break in wafer polishing and chip division steps. When the thickness of the gallium nitride substrate is in the range between 50 $\mu$m or more and 250 $\mu$m or less, the number of defects in the shape of the chips, such as nicks or the like, is few and the wafer substantially does not break in the polishing and chip division steps.

The nitride semiconductor light emitting chip of the present invention is characterized by having a structure such that at least one of the chip division facets is a facet substantially perpendicular to a cleave facet of the gallium nitride substrate.

According to the present invention, it is possible to prevent production yield in the chip division step from decreasing because an adjustment in direction of the grooves is made with ease and the deviations in the direction are minimized by forming the chip division facet in a direction substantially perpendicular to the cleave facet. Moreover, the grooves are formed in a direction substantially perpendicular to the cleave facet so that an angle of the chip does not become acute, thereby substantially eliminating the occurrence of nicks in a chip.

The nitride semiconductor light emitting chip of the present invention is characterized by having a structure such that the side length of the division facet in the cleave facet direction of the gallium nitride substrate is longer than that in the division facet substantially perpendicular to the cleave facet of the gallium nitride substrate.

According to the present invention, it is possible to produce a rectangular chip such that a shorter side direction thereof is a direction substantially perpendicular to a cleave facet direction and a longer side direction thereof is a cleave facet direction. A greater force is applied to the shorter side, since division is not easily made in the direction perpendicular to the cleave facet direction. Therefore, an appropriate force can be applied to a groove based on leverage so that the chips are produced at a high yield.

The nitride semiconductor light emitting chip of the present invention is characterized by having a structure such that all of the chip division facets are the cleave facets of the gallium nitride substrate. Because of this characteristic, the number of defects in the shape of the chips, such as nicks or the like, may be few. Accordingly, a chip having a satisfactory condition of the cross-sectional portions can be produced at a high yield.

The gallium nitride-based compound semiconductor chip of the present invention includes a gallium nitride substrate with a (0001) facet of a wurtzite type crystal structure as a principal facet and a gallium nitride-based compound semiconductor crystal formed on the gallium nitride substrate. The gallium nitride-based compound semiconductor chip is characterized in that at least two of the chip division facets deviate by 15 degrees from the cleave facet of the gallium nitride substrate and are formed in directions substantially perpendicular to each other. When the division facets are formed in the directions deviated by 15 degrees from the cleave facet, that is, at least two of the division facets deviate by 15 degrees from the cleave facet. Therefore, the division in one facet is not easier than that in the other facet, such that, the ease of division is equal in both directions or the difference in the ease of division becomes less. Therefore, the division is equally made in both facets and the number of defects in the shape of the chips, such as nicks or the like, may be few.

The thickness of the gallium nitride substrate may be in the range between 50 $\mu$m or more and 250 $\mu$m or less. When the thickness of the gallium nitride-substrate is greater than 250 $\mu$m, the number of the chips having defects in the shape, such as nicks or the like, increases in the chip division step because the gallium nitride substrate is relatively hard. When the thickness of the wafer is smaller than 50 $\mu$m, the wafer becomes easy to break in the wafer polishing and chip division steps. When the thickness of the gallium nitride substrate is in the range between 50 $\mu$m or more and 250 $\mu$m or less, the number of defects in the shape of the chips, such as nicks or the like, is few and the wafer substantially does not break in the polishing and chip division steps.

A method for producing a gallium nitride-based compound semiconductor chip of the present invention is characterized by including: a wafer formation step of forming a wafer having a gallium nitride-based compound semiconductor crystal grown on a gallium nitride substrate with a (0001) facet of a wurtzite type crystal structure as a principal facet so that the thickness of the gallium nitride substrate is in the range between 50 $\mu$m or more and 250 $\mu$m or less; a groove formation step of forming grooves for the chip division on the wafer; and a division step of dividing the wafer into gallium nitride-based compound semiconductor chips.

The gallium nitride substrate with a (0001) facet of a wurtzite type crystal structure as a principal facet is formed so as to have the thickness in the range between 50 $\mu$m or more and 250 $\mu$m or less. Therefore, the number of defects in the shape of the chips, such as nicks or the like, is few and the wafer does not break in the polishing and chip division steps.

The present invention is characterized in that the groove formation step includes a step of forming grooves in a cleave facet direction of the gallium nitride substrate and a step of forming grooves in a direction substantially perpendicular to the cleave facet direction.

According to the present invention, it is possible to prevent production yield in the chip division step from decreasing because an adjustment in the direction of the grooves is made with ease and the deviations in the direction are minimized by forming the chip division facet in directions substantially perpendicular to each other. Moreover, the grooves are formed in a direction substantially perpendicular to the cleave facet so that an angle of the chip does not become acute, thereby substantially eliminating the occurrence of nicks in a chip.

The present invention is characterized in that the groove formation step includes a step of forming grooves in directions substantially perpendicular to each other, and each direction deviates by 15 degrees from the cleave facet of the gallium nitride substrate.

According to the present invention, the grooves are formed in mutually orthogonal directions deviated by 15 degrees from the cleave facet. The wafer is divided along the grooves formed in such directions so that the division facets are formed in the directions deviated by 15 degrees from the cleave facet. Therefore, both of the facets equally deviate from the cleave facet and division in one facet cannot be easier than that in another facet. Since the ease of division is equal in both directions of the difference in the ease of division becomes less, the division is equally made in both facets and the number of defects in the shape of the chips, such as nicks or the like, may be few.

The groove formation step may include a step of forming grooves on both sides of the wafer so that the grooves on one side are formed in positions corresponding to the grooves on the other side. Therefore, the ease of the chip division is improved and a production yield of the chips of satisfactory quality may be further improved.

A method for producing a gallium nitride-based compound semiconductor chip of the present invention is characterized by including: a wafer formation step of forming a wafer having a gallium nitride-based compound semiconductor crystal grown on a gallium nitride substrate with a (0001) facet of a wurtzite type crystal structure as a principal facet; a groove formation step of forming grooves in a cleave facet direction of the gallium nitride substrate; and a division step of dividing the wafer into gallium nitride-based compound semiconductor chips.

According to the present invention, the number of defects in the shape of the chips, such as nicks or the like, may be few because of the chip division made in a cleave facet of the wurtzite type crystal structure. Accordingly, chips having a satisfactory condition of the cross-sectional portions can be produced at a high yield.

A method for producing a gallium nitride-based compound semiconductor chip of the present invention is characterized in that the wafer formation step includes a step of producing the wafer so that the thickness of the gallium nitride substrate is in the range between 50 $\mu$m or more and 250 $\mu$m or less.

When the thickness of the gallium nitride-substrate is greater than 250 $\mu$m, the number of the chips having defects in the shape, such as nicks or the like, increases in the chip division step because the gallium nitride substrate is relatively hard. When the thickness of the wafer is smaller than 50 $\mu$m, the wafer becomes easy to break in the wafer polishing and chip division steps. When the thickness of the gallium nitride substrate is in the range between 50 $\mu$m or more and 250 µm or less, the number of defects in the shape of the chips, such as nicks or the like, is few and the wafer substantially does not break in the polishing and chip division steps.

A method for producing a gallium nitride-based compound semiconductor chip of the present invention is characterized in that the groove formation step includes a step of forming grooves in a direction substantially perpendicular to the cleave facet direction of the gallium nitride substrate.

According to the present invention, it is possible to prevent a production yield in the chip division step from decreasing because an adjustment in the direction of the grooves is made with ease and the deviations in the direction are minimized by forming the chip division facet in a direction substantially perpendicular to the cleave facet. Moreover, the grooves are formed in a direction substantially perpendicular to the cleave facet so that an angle of the chip does not become acute, thereby substantially eliminating the occurrence of nicks in a chip.

A method for producing a gallium nitride-based compound semiconductor chip is characterized in that the groove formation step includes a step of forming grooves so that the length of the grooves corresponding to a single chip formed in the cleave direction of the gallium nitride substrate is longer than the length of the grooves corresponding to a single chip formed in a direction substantially perpendicular to the cleave facet direction of the gallium nitride substrate.

According to the present invention, it is possible to produce a rectangular chip such that a shorter side direction thereof is a direction substantially perpendicular to a cleave facet direction and a longer side direction thereof is a cleave facet direction. A greater force is applied to the shorter side, since division is not easily made in the direction perpendicular to the cleave facet direction. Therefore, an appropriate force can be applied to a groove based on leverage so that the chips are produced at a high yield.

A method for producing a gallium nitride-based compound semiconductor chip of the present invention is characterized in that the groove formation step includes a step of forming grooves along at least two cleave facet directions of the gallium nitride substrate so that the grooves substantially surround certain regions on the wafer.

Because of this characteristic, all of the division facets may be the cleave facets of the gallium nitride substrate. Therefore, the number of defects in the shape of the chips, such as nicks or the like, may be few. Accordingly, a chip having a satisfactory condition of the cross-sectional portions can be produced at a high yield.

A method for producing a gallium nitride-based compound semiconductor chip of the present invention is characterized by including: a wafer formation step of forming a wafer having a gallium nitride-based compound semiconductor crystal grown on a gallium nitride substrate with a (0001) facet of a wurtzite type crystal structure as a principal facet; a groove formation step of forming grooves in directions substantially perpendicular to each other, each of the directions of grooves deviates by 15 degrees from the cleave facet of the gallium nitride substrate; and a division step of dividing the wafer into gallium nitride-based compound semiconductor chips.

When the division facets are formed in the directions deviated by 15 degrees from the cleave facet, that is, at least two of the division facets deviate by 15 degrees from the cleave facet. Therefore, the division in one facet is not easier than that in the other facet, such that, the ease of division is equal in both directions or the difference in the ease of division becomes less. Therefore, the division is equally made in both facets and the number of defects in the shape of the chips, such as nicks or the like, may be few.

The gallium nitride-based compound semiconductor wafer of the present invention includes a gallium nitride substrate with a (0001) facet of a wurtzite type crystal structure as a principal facet and a gallium nitride-based compound semiconductor crystal grown on the gallium nitride substrate. The grooves are formed on a surface of the gallium nitride-based compound semiconductor wafer at least in a cleave facet direction of the gallium nitride substrate.

The wafer of the present invention is divided relatively easy in a cleave facet of the wurtzite type crystal structure, thereby decreasing the number of defects in the shape of the chips, such as nicks or the like. Therefore, chips having a satisfactory condition of the cross-sectional portions can be produced at a high yield by dividing the wafer.

Grooves are formed on the surface of the gallium nitride-based compound semiconductor wafer in a direction substantially perpendicular to the cleave facet direction of the gallium nitride substrate.

According to the present invention, it is possible to prevent production yield in the chip division step from decreasing because an adjustment in direction of the grooves is made with ease and the deviations in the direction are minimized by forming grooves on the surface of the gallium nitride-based compound semiconductor wafer in a direction substantially perpendicular to the cleave facet direction. Moreover, the grooves are formed in a direction substantially perpendicular to the cleave facet so that an angle of the chip does not become acute, thereby substantially eliminating the occurrence of nicks in a chip.

The gallium nitride-based compound semiconductor wafer of the present invention is produced so that a depth of the grooves substantially perpendicular to the cleave facet direction of the gallium nitride substrate is greater than a depth of the grooves in the cleave facet direction of the gallium nitride substrate. The ease of division is equal in both directions or the difference in the ease of division becomes smaller, thereby producing chips of satisfactory quality without defects, such as nicks or the like.

The gallium nitride-based compound semiconductor wafer of the present invention is produced so that the grooves are formed on the gallium nitride-based compound semiconductor crystal. Therefore, it is possible to improve an yield of chip division because the accuracy of the position adjustment of the grooves improves and thus deviation in the position of the grooves is reduced.

The gallium nitride-based compound semiconductor wafer of the present invention is characterized in that all of the grooves are formed in the cleave facet direction of the gallium nitride substrate. All of the division facets of the gallium nitride-based compound semiconductor chips can be cleave facets of the gallium nitride substrate. Therefore, it is possible to produce chips having a satisfactory shape at a high yield.

The gallium nitride-based compound semiconductor wafer of the present invention is characterized in that grooves are formed on one surface and further grooves are formed on a surface opposite from said one surface so as to correspond to the grooves formed thereon. Therefore, the ease of the chip division can be improved and production yield of satisfactory chips can be further improved.

The gallium nitride-based compound semiconductor wafer of the present invention comprises a gallium nitride substrate with a (0001) facet of a wurtzite type crystal structure as a principal facet and a gallium nitride-based compound semiconductor crystal formed on the gallium nitride substrate. Grooves are formed on a surface of the gallium nitride-based compound semiconductor wafer in directions substantially perpendicular to each other so that each of the directions of the grooves deviates by 15 degrees from a cleave facet direction of the gallium nitride substrate.

According to the present invention, when the grooves on a surface of the wafer are formed in mutually orthogonal directions deviated by 15 degrees from the cleave facet, both of the facets on the surface of the wafer deviate by 15 degrees from the cleave facet. Therefore, the division in one facet is not easier than that in another facet. Therefore, the division is equally made in both facets and defects in the shape of the chips, such as nicks or the like, substantially does not occur.

In a method for forming chip division grooves, a scriber or dicer or etching technique may be used. In the case of using a wet etching technique, for example, a mixed acid of sulfuric acid and phosphoric acid can be used. In the case of using a dry etching technique, a method such as reactive ion etching, ion milling, focused ion beam etching, ECR etching, etc., can be used.

Thus, the invention described herein makes possible the advantages of: (1) providing a gallium nitride-based compound semiconductor chip having a satisfactory shape produced as a result of dividing a wafer using a gallium nitride substrate having a wurtzite type crystal structure; (2) providing a method for producing such a chip at a high yield; and (3) providing a gallium nitride-based compound semiconductor wafer divided into chips having a satisfactory shape.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

The present invention will be described below by way of illustrative, non-limiting examples with reference to the accompanying drawings.

In Example 1, the present invention is applied to a light emitting device, e.g., an LED device, having a square or rectangular chip shape.

Figure 1:
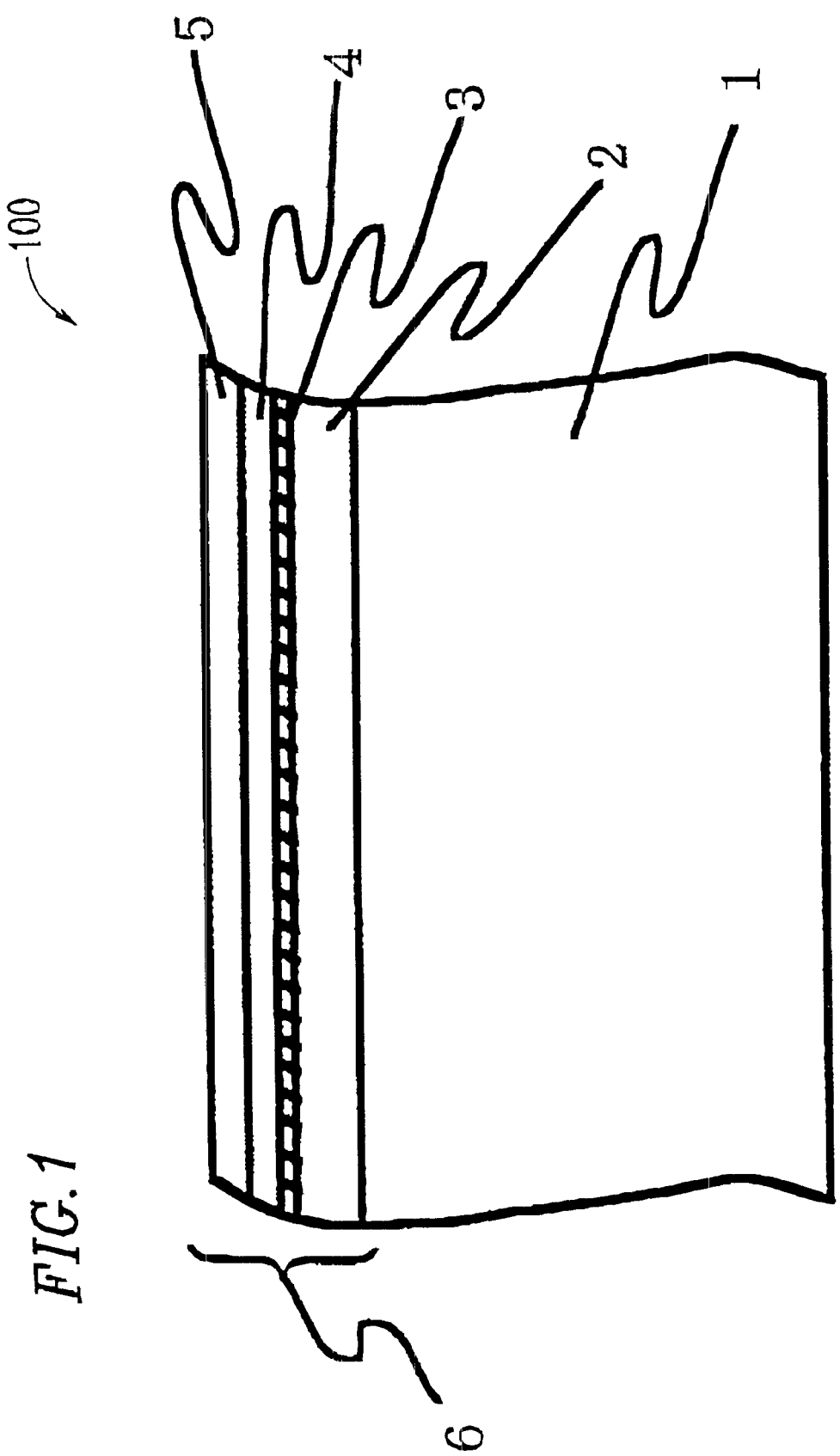
FIG. 1 is a cross-sectional view of a wafer produced by growing a gallium nitride-based compound semiconductor structure on a gallium nitride substrate.
Figure 5:
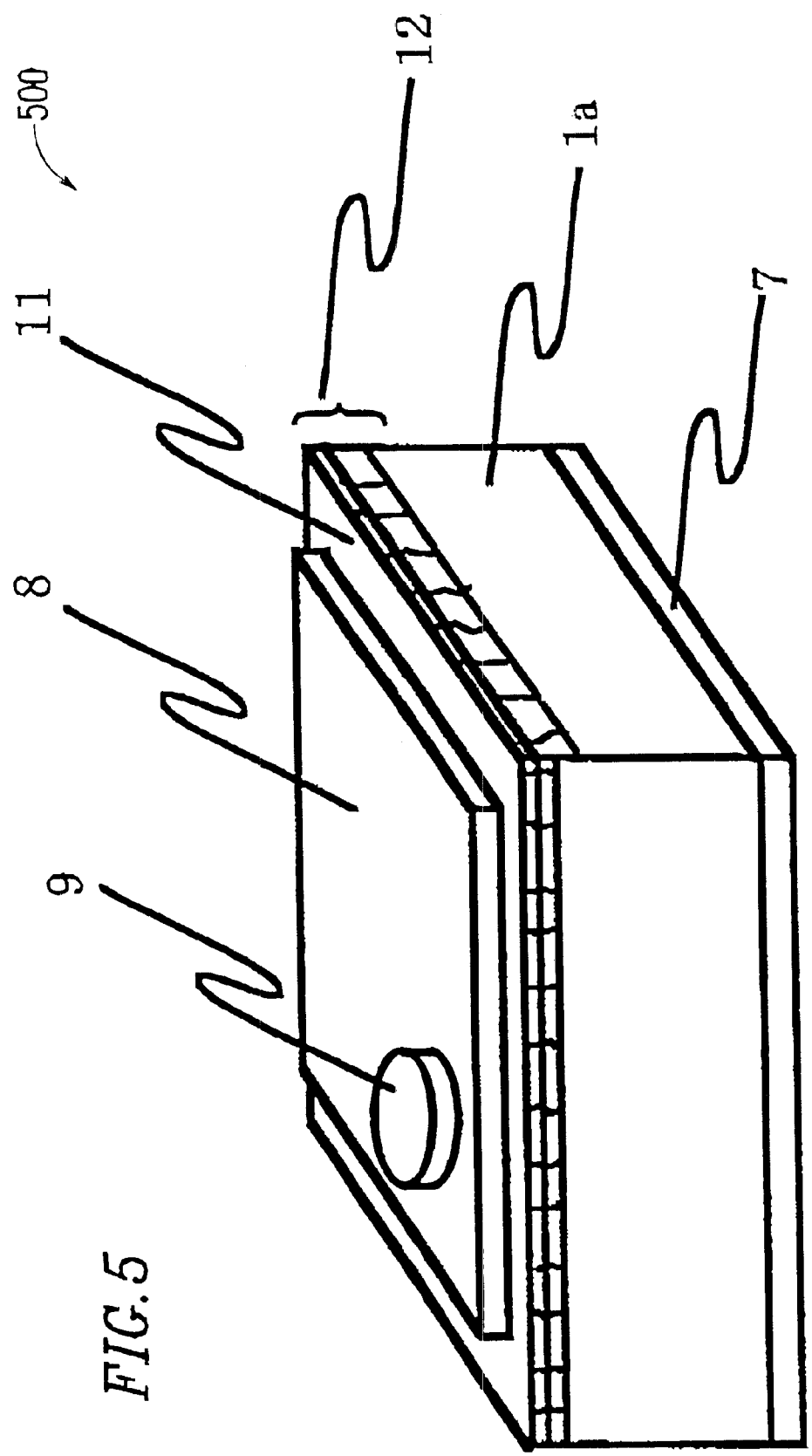
FIG. 5 is a structural diagram of a gallium nitride-based compound semiconductor chip as a light emitting device produced in Example 1.

FIG. 5 is an isometric view of a gallium nitride-based compound semiconductor chip 500 according to Example 1 of the present invention. The gallium nitride-based compound semiconductor chip 500 is produced by dividing a wafer 100, as shown in FIG. 1, after performing different production steps shown in FIGS. 2 and 3. FIG. 1 shows a cross-sectional view of the wafer 100 including a gallium nitride substrate and a gallium nitride-based compound semiconductor crystal formed thereon. The wafer 100 includes an n-type gallium nitride (GaN) substrate 1 and an MOCVD growth layer 6 provided on top of the substrate 1 as a gallium nitride-based compound semiconductor structure.

Note that in this specification, a "wafer" is defined not only as a structure including a gallium nitride substrate and a gallium nitride-based compound semiconductor structure, but also as a structure including other elements provided as part of the gallium nitride substrate and the gallium nitride-based compound semiconductor structure prior to the dividing of the wafer to produce gallium nitride-based compound semiconductor chips.

Figure 2:
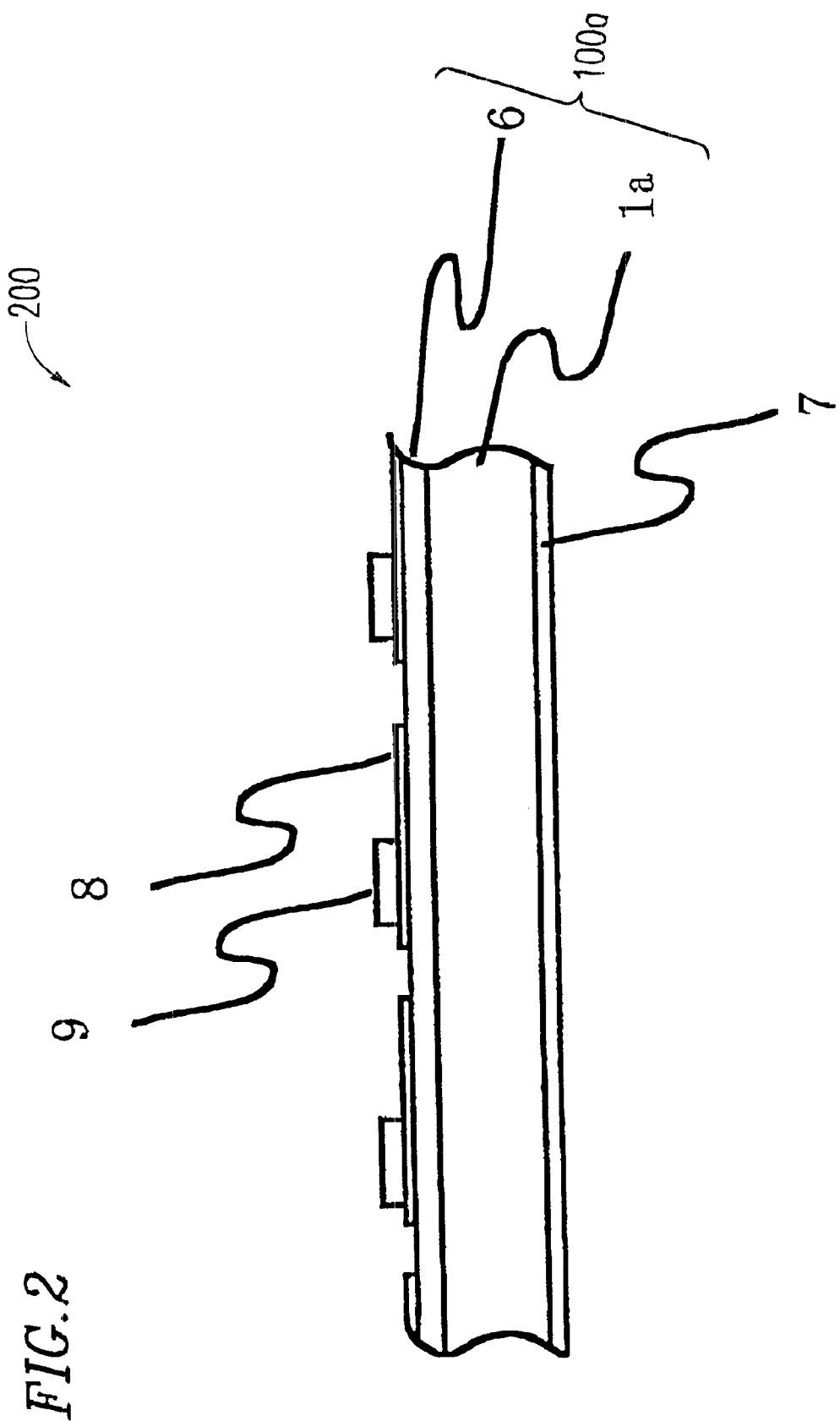
FIG. 2 is a cross-sectional view of the wafer illustrating a production step of Example 1 of the present invention.
Figure 3:
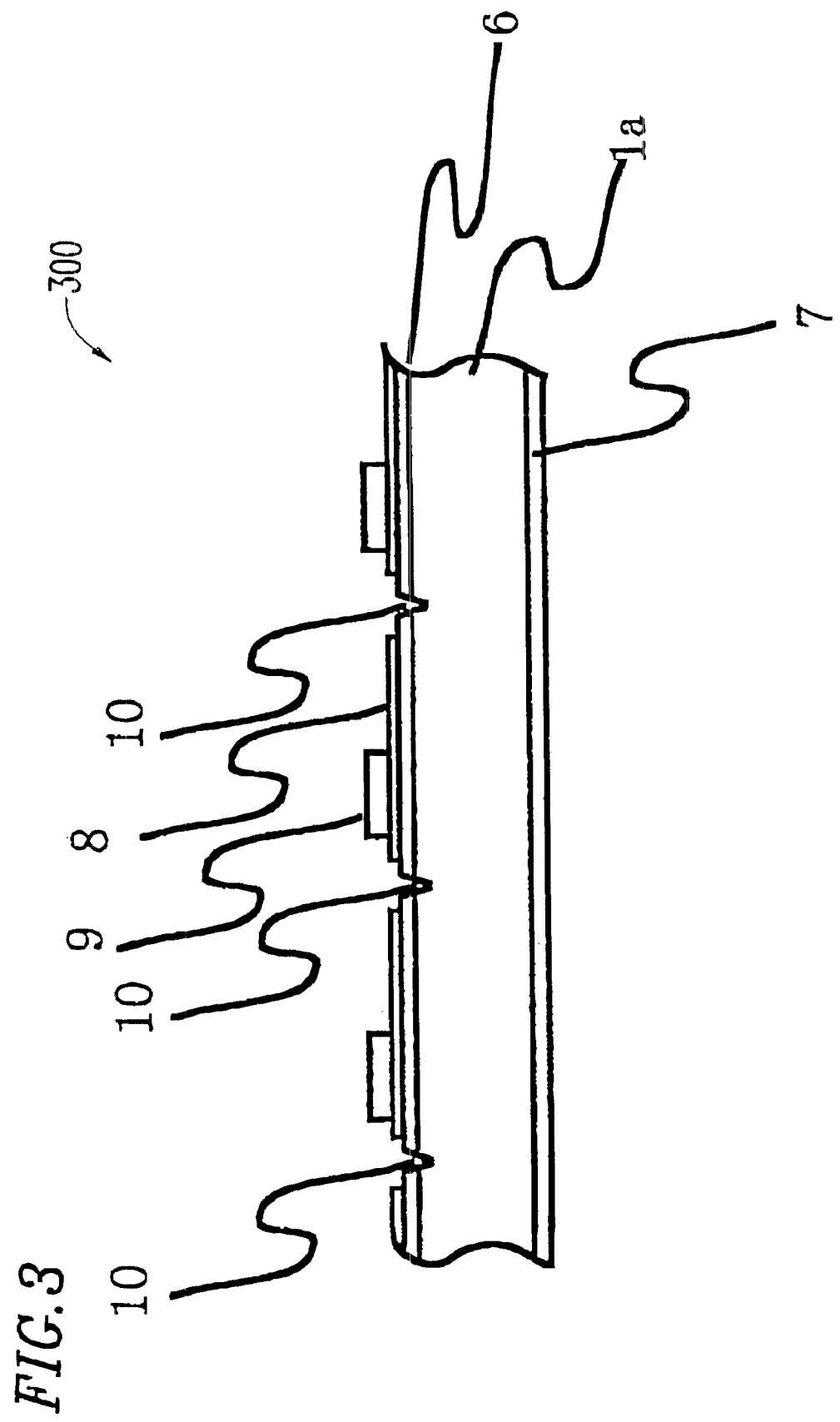
FIG. 3 is a cross-sectional view of the wafer illustrating another production step of Example 1 of the present invention.

FIGS. 1 through 3 are cross-sectional views of the wafer in different stages of producing the gallium nitride-based compound semiconductor chip 500. The wafers in these different production stages are represented by reference numerals 100, 200 and 300, respectively.

The MOCVD growth layer 6 includes an n-type GaN layer 2, about 0.5 $\mu$m in thickness, a quantum well active layer 3 formed of $In_{(x)}Ga_{(1-x)}N$, a p-type AlGaN layer 4, about 30 nm in thickness, and a p-type GaN layer 5, about 0.05 $\mu$m in thickness. The n-type gallium nitride (GaN) substrate 1 is about 400 $\mu$m thick and has a wurtzite type crystal structure formed by a hydride vapor phase epitaxy (HVPE) method or the like. A principal facet of the substrate 1 is a (0001) facet.

The gallium nitride-based compound semiconductor chip 500 using the wafer 100 is produced, for example, in the following manner. The MOCVD growth layer 6 is formed by sequentially laminating, on the gallium nitride substrate 1, the n-type GaN layer 2, the quantum well active layer 3, the p-type AlGaN layer 4 and the p-type GaN layer 5 by a metal organic chemical vapor deposition (MOCVD) method. The quantum well active layer 3 may include a semiconductor layer including phosphorus or arsenic instead of nitrogen as a Group V element.

When the thickness of the GaN substrate 1 is smaller than 300 $\mu$m, it may be difficult to retain the substrate when forming the MOCVD growth layer 6. On the other hand, when the thickness of the GaN substrate 1 is greater than 400 μm, there may be problems, such as, thermal conduction becomes worse and the material costs rise. Therefore, it is desirable that the thickness of the GaN substrate 1 used in the MOCVD growth process is in the range between 300 μm or more and 400 μm or less. It is also desirable that deviations in a facet orientation of the GaN substrate 1 is within ±0.5 degrees from the (0001) facet in order to provide the MOCVD growth layer 6 with satisfactory crystallinity.

The thickness of the growth layer on the gallium nitride substrate is preferably 5 μm or less and extremely thin in comparison with that of the GaN substrate. Accordingly, in this specification, it is considered that the gallium nitride substrate and the wafer are substantially equal in thickness.

Next, a bottom surface of the GaN substrate 1 of the wafer 100, which does not have the MOCVD growth layer 6 formed thereon, is polished by a polisher so as to make the thickness of the wafer 100 about 80 μm (see FIG. 2). As shown in FIG. 2, the post-polishing wafer 100 is represented by reference 100a, and the post-polishing GaN substrate is represented by reference 1a.

Then, an n-type electrode 7 is formed on the bottom surface of the GaN substrate 1a of the wafer 100a. On the top layer of the MOCVD growth layer 6, i.e., on the p-type GaN layer 5, a p-type transparent electrode 8 is formed in a prescribed pattern, and then a p-type electrode 9 is formed on the p-type transparent electrode 8 in a prescribed pattern.

Figure 4:
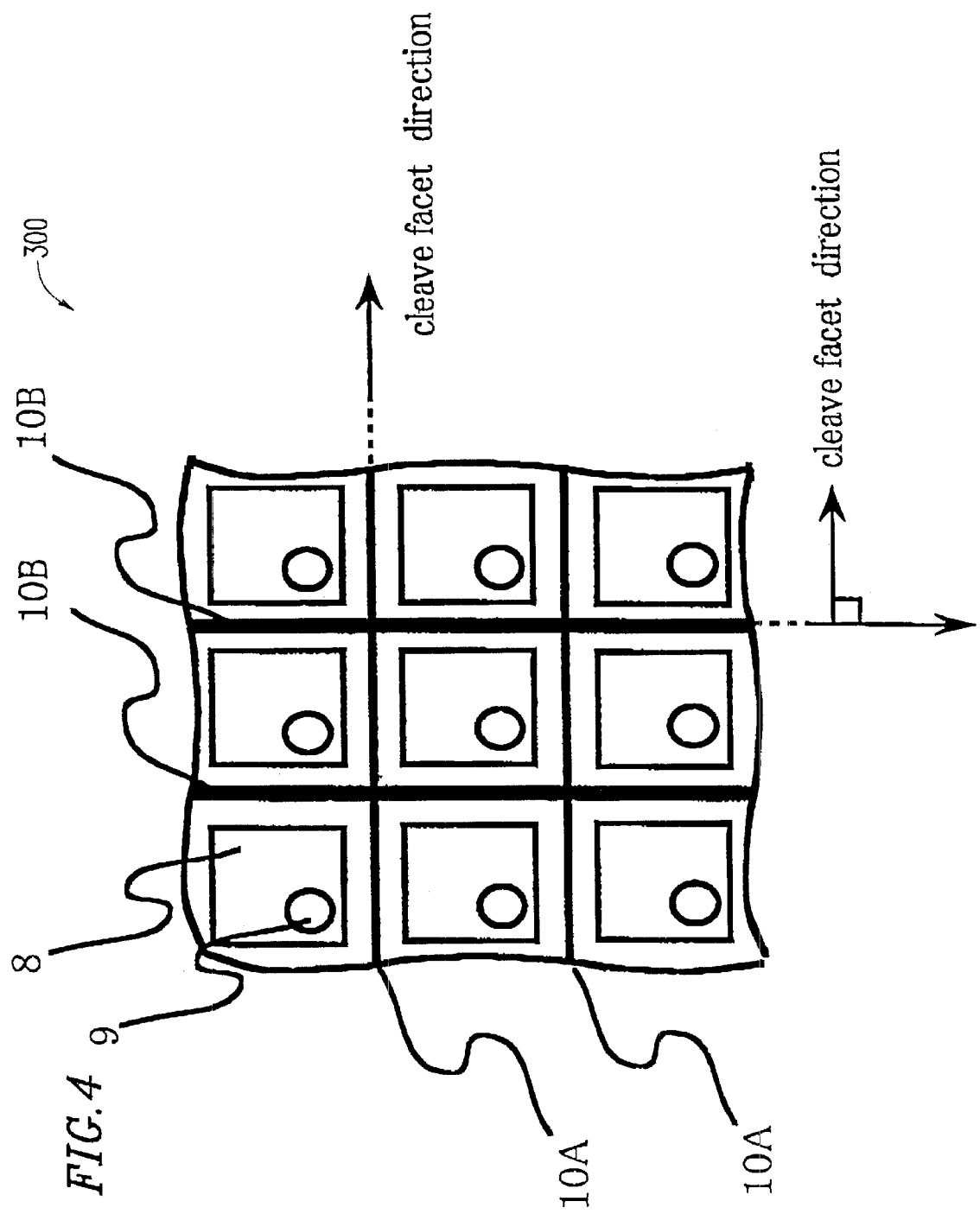
FIG. 4 is a plan view of the wafer illustrating groove formation directions for the chip division of Example 1 of the present invention.

Referring to FIG. 3, after putting an adhesive tape on the bottom surface of the wafer 100a so as to cover the n-type electrode 7, grooves 10 are formed by using a scriber on the p-type GaN layer 5 in two mutually orthogonal directions at a pitch of about 250 μm. FIG. 4 shows a plan view of the wafer 300 having the grooves. As shown in FIG. 3, the grooves 10 are formed in a region where there is no p-type transparent electrode 8. As shown in FIG. 4, the directions in which the grooves 10 are formed are a cleave facet direction of the GaN substrate 1a (FIG. 3) and a direction substantially perpendicular thereto. The grooves 10 extending in the cleave facet direction are represented by the reference 10A, and the grooves 10 extending in the direction substantially perpendicular to the cleave facet direction are represented by the reference 10B. The direction in which the grooves 10A are formed may be any direction parallel to the cleave facet of the GaN substrate 1a, which is parallel to the orientations (10-10), (1-100) and (01-10). The grooves 10A are formed so as to be about 2 μm deep from the surface of the p-type GaN layer 5, and the grooves 10B are formed so as to be about 5 μm deep from the surface of the p-type GaN layer 5. As shown in FIG. 4, it goes without saying that the p-type transparent electrode 8 is patterned in consideration with the directions of the grooves 10A and 10B to be formed later.

Figure 11:
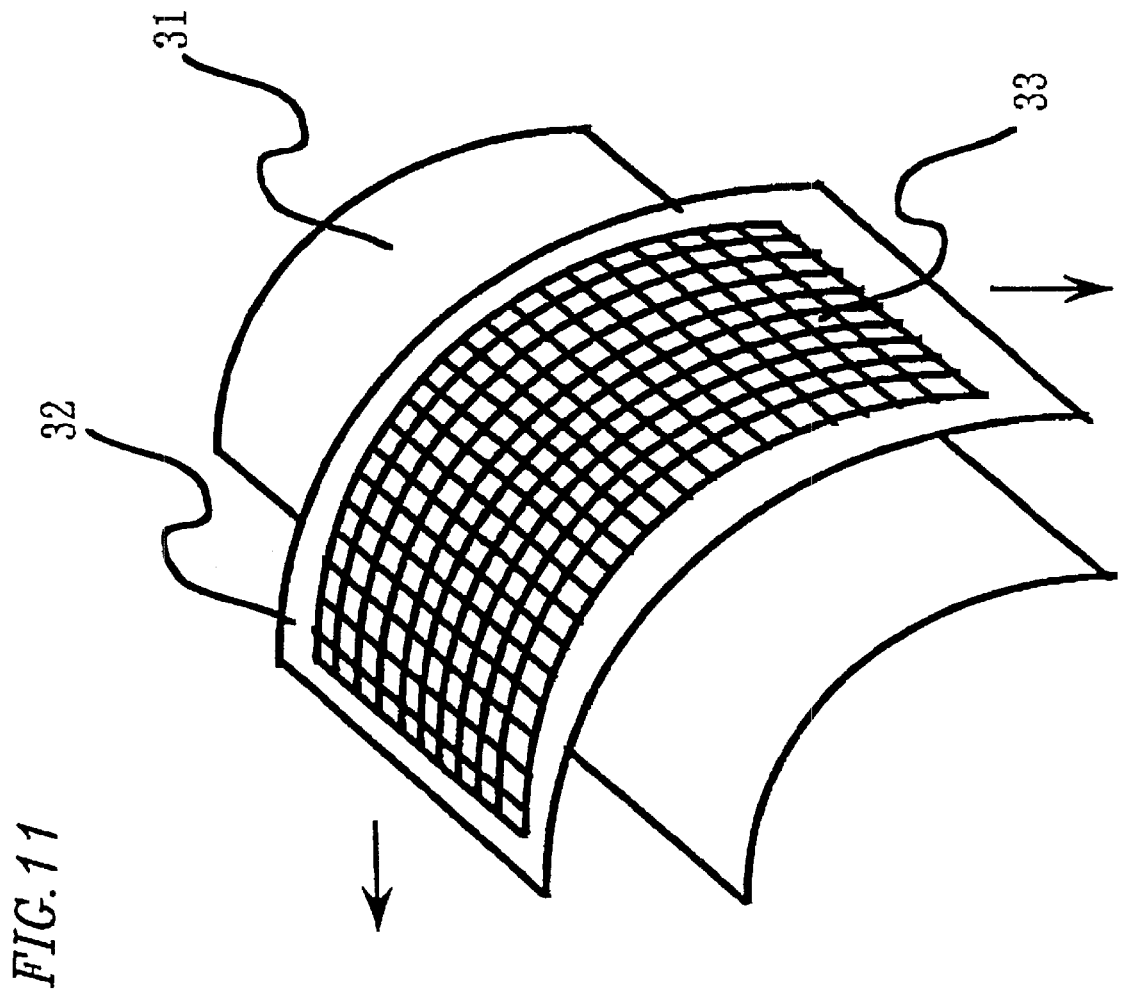
FIG. 11 is a diagram illustrating a method for dividing a wafer.

Then, as shown in FIG. 11, the wafer is divided into chips by lightly applying an external force to the wafer (represented by reference numeral 33) along the grooves 10A and 10B. More specifically, the wafer 33 having an adhesive tape 32 attached to the surface of the n-type electrode 7 is bent by 90 degrees and pressed onto a curved member 31. Thus, the wafer 33 is divided along the grooves 10A and 10B, thereby producing gallium nitride-based compound semiconductor chips 500 as shown in FIG. 5 (only one of such is shown in FIG. 5). The chip 500 made by this division has slight unevenness only on cross-sectional portions 12 which correspond to the grooves 10A and 10B, but does not exhibit any defects in the shape, such as nicks or the like. Thus, the chips 500 having a satisfactory shape are produced at a high yield.

The foregoing are descriptions of the case where the shape of the chips is substantially square. The following are descriptions of the case where the shape of the chips is rectangular.

Figure 12:
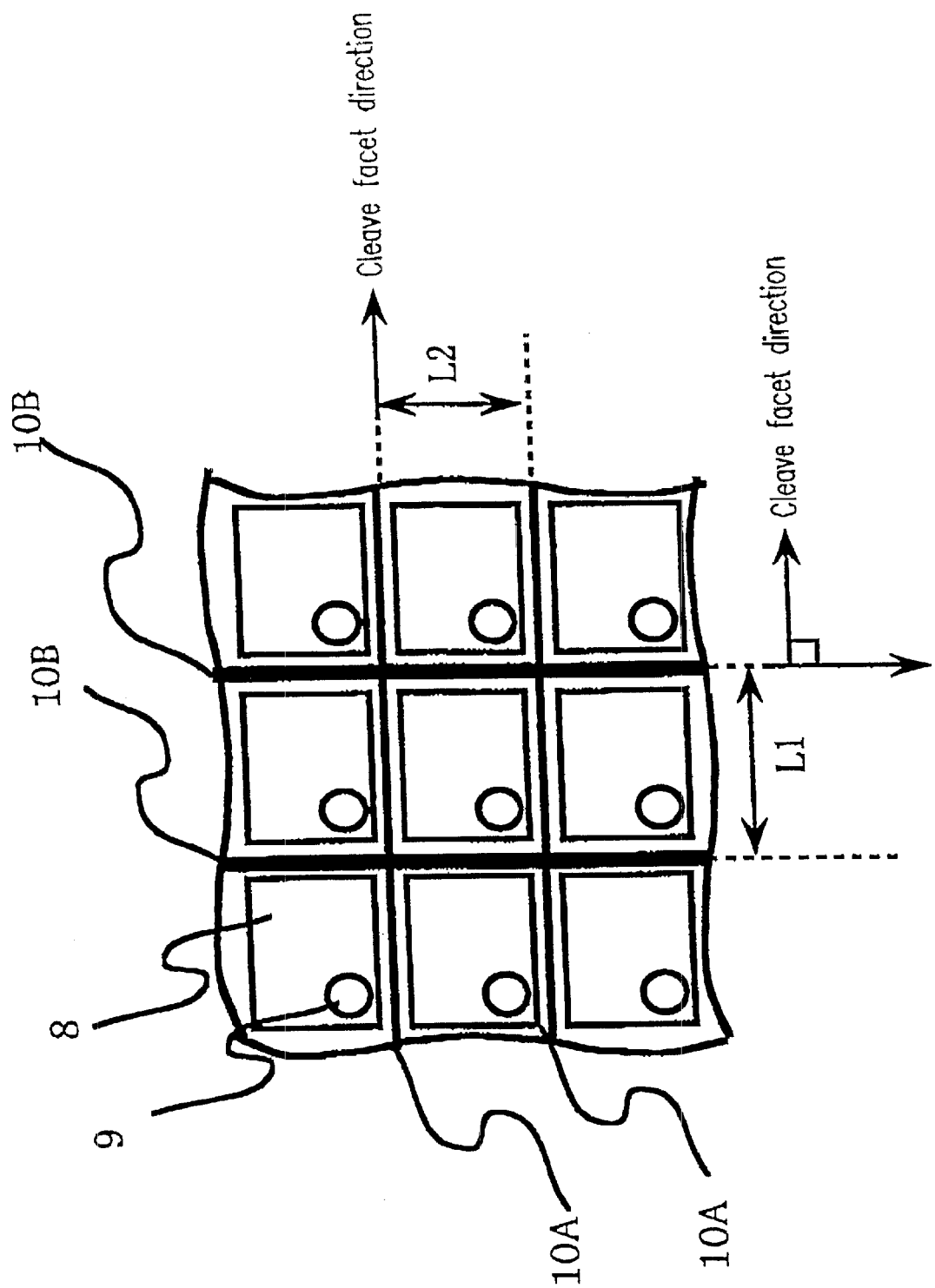
FIG. 12 is a plan view of a wafer illustrating the groove formation for division into rectangular chips.

To make the shape of the chips rectangular, as shown in FIG. 12, the pitch of the grooves formed on the wafer by the scriber is adjusted so that the relationship between the chip length in a direction parallel to the cleave facet (L1) and the chip length in a direction substantially perpendicular to the cleave facet (L2) is L1>L2. The reason why this adjustment is necessary will be described below.

In order to divide a wafer into chips after grooves have been formed, a force is applied almost evenly to the entire wafer attached to an adhesive tape. However, the applied force to the grooves along the shorter sides is actually greater than that applied to the grooves along the longer sides because of leverage. Accordingly, chips are made to be rectangular so that the shorter sides to which a greater force is applied are in a direction substantially perpendicular to the cleave facet, in which division into chips is not easily made, and the longer sides are in the cleave facet direction. Therefore, the external force is properly applied to the grooves, and chips are produced at a higher yield.

When the thickness of the post-polishing wafer 100a is thicker than 250 μm, the number of the chips having defects in the shape, such as nicks or the like, increases because the GaN substrate 1a is relatively hard, thereby decreasing the yield. If the wafer is polished until the thickness thereof becomes smaller than 50 μm, the wafer may be broken during the polishing process, thereby decreasing the yield. Accordingly, the thickness of the post-polishing wafer 100a needs to be in the range between 50 μm or more and 250 μm or less in order to produce chips at a high yield. It is more preferred that the range is between 50 μm or more and 100 μm or less.

In this example, the grooves 10A and 10B are formed on the top surface of the MOCVD growth layer 6 (FIG. 3). The reasons for such are that: (1) regions where there is no p-type transparent electrode 8 can be confirmed easily; and (2) the accuracy of the position adjustment of the grooves 10A and 10B improves and thus deviation in the position of the grooves 10A and 10B is reduced, thereby improving the production yield of the chips.

The grooves are formed along almost the whole perimeter of the chip 500 in the above example. Nearly 30% or more of the whole perimeter of the chip 500 is sufficient for the area in which the grooves are formed. When the area in which the grooves are formed is less than 30% of the whole perimeter, the number of defects in the shape, such as nicks in a chip or the like, may increase, thereby causing a problem that the production yield of the chips decreases.

When the chips are formed so that unevenness on the surface of the polished GaN substrate 1a (FIG. 2) is greater than the wavelength of a light to be emitted inside the GaN substrate 1a, a reflectance of the light in the interface between the GaN substrate 1a and the n-type electrode 7 becomes greater, and the amount of emitted light from the p-type transparent electrode 8 would increase. Therefore it would be possible to improve the light emission property of the device.

In the scribing process, the depth of the grooves 10B formed in the direction substantially perpendicular to the cleave facet of the GaN substrate 1a is preferably greater than that of the grooves 10A formed in the cleave facet direction. The reason for this is that if the depths of the grooves in both directions are formed to be equal to each other, ease of division into chips in the cleave facet direction differs from that in the other direction, thereby causing a great number of defects in the shape of the chip, such as nicks or the like. The division into chips is relatively difficult in the direction substantially perpendicular to the cleave facet. Accordingly, the depth of the grooves in the direction substantially perpendicular to the cleave facet is formed so as to be greater than that of the grooves formed in the cleave facet direction, so as to make the ease of division into chips in both directions equal to each other or so as to make the difference in the ease of division into chips in both directions less. Therefore, it is possible to produce chips of satisfactory quality substantially without defects, such as nicks or the like. The grooves 10A and 10B are formed by using the scriber to an appropriate depth in order to equalize the ease of the division in both the cleave facet direction and the direction substantially perpendicular to the cleave facet. The width of the grooves 10A and 10B is determined by the shape of the scriber. In Example 1 of the present invention, the width is formed to be relatively wider by forming the grooves to be deeper. The ease of division into chips depends greatly on the depth of the grooves, but hardly on the width of the grooves.

Whether the chip shape is rectangular or square, the following effects (1) and (2) can be attained by forming the chip division facet in a direction substantially perpendicular to the cleave facet: (1) production yield in the chip division step is prevented from decreasing because an adjustment in direction of the grooves can be made with ease and the deviation in the direction is minimized; and (2) defects in a chip substantially does not occur because an angle of the chip does not become acute.

EXAMPLE 2

In Example 2, the present invention is also applied to a light emitting device, e.g., an LED device.

In the same way as in Example 1, as shown in FIG. 1, after an MOCVD growth layer 6 is formed on a top surface of a GaN substrate 1 having a wurtzite type crystal structure and a (0001) facet as a principal facet, a bottom surface of the GaN substrate 1 of a wafer 100 is polished so that the thickness thereof is in the range between 50 µm or more and 250 µm or less, and is most preferably about 80 µm.

As shown in FIG. 3, an n-type electrode 7 is formed on the bottom surface of the GaN substrate 1a of the wafer 100 in the electrode formation step. On a top layer of the MOCVD growth layer 6 including a quantum well active layer 3 (FIG. 1), i.e., on the p-type GaN layer 5, a p-type transparent electrode 8 is formed in a prescribed pattern, and then a p-type electrode 9 is formed on the n-type transparent electrode 8 in a prescribed pattern.

Figure 6:
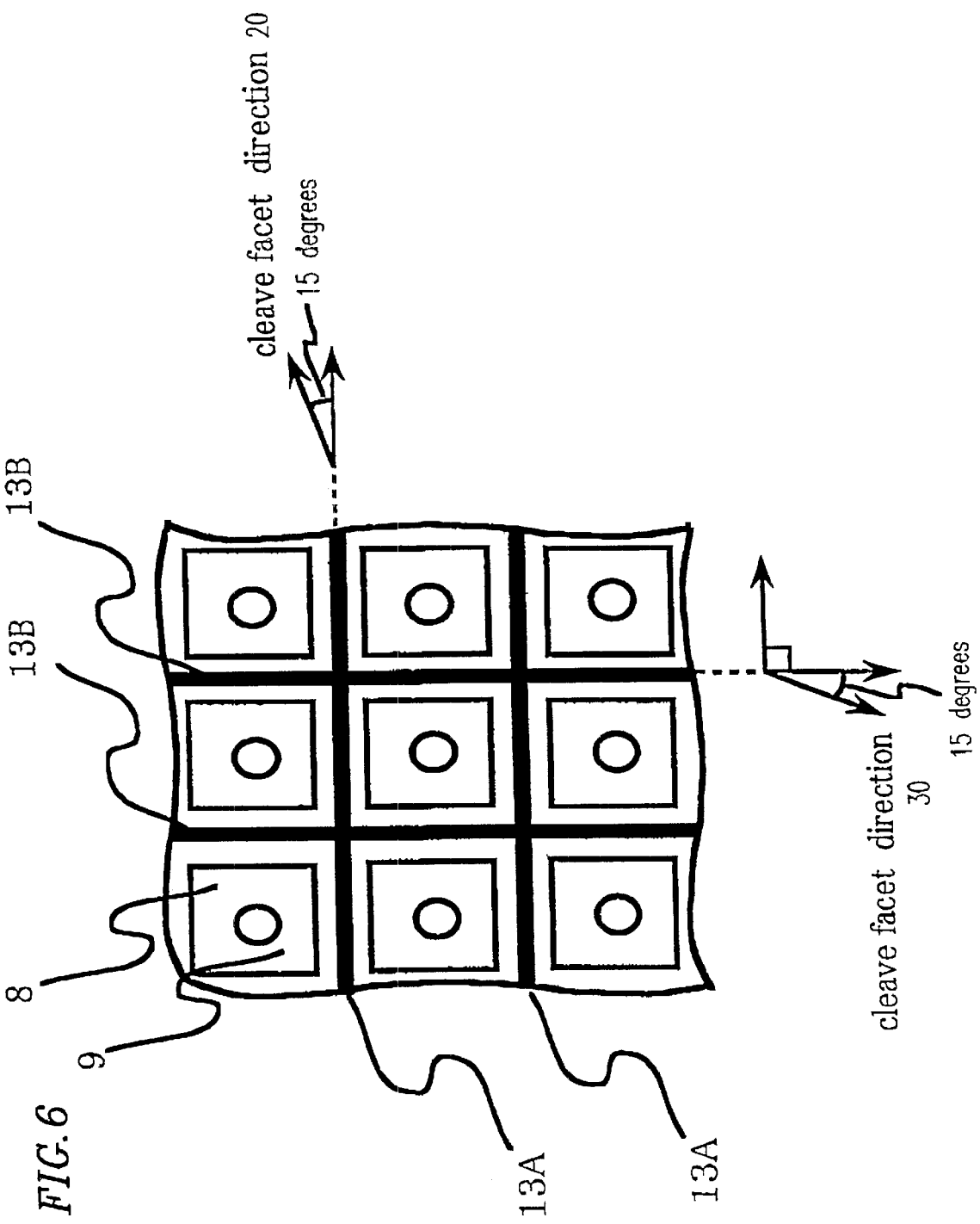
FIG. 6 is a plan view of a wafer illustrating groove formation directions for the chip division of Example 2 of the present invention.

Next, after putting an adhesive tape on a bottom surface of the wafer 100 so as to cover the n-type electrode 7 for the scribe process, grooves 13A and 13B, as shown in FIG. 6, are formed by using a scriber on the surface of the p-type GaN layer 5 in two mutually orthogonal directions at a pitch of about 250 µm. More specifically, the grooves 13A are formed so as to be about 4 µm deep from the surface of the p-type GaN layer 5 in a direction deviated by 15 degrees from a cleave facet direction 20 of the GaN substrate 1a. The grooves 13B are formed in a direction substantially perpendicular to the grooves 13A so as to have the depth and width equal to those of the groove 13A (the depth: about 4 µm). Since the grooves 13B are formed in the direction substantially perpendicular to the grooves 13A as described above, the grooves 13B also deviate by 15 degrees from a cleave facet direction 30 of the GaN substrate 1a. As shown in FIG. 6, it goes without saying that the p-type transparent electrode 8 is patterned in consideration with the directions of the grooves 13A and 13B to be formed later. And then, the wafer is divided into chips along the grooves 13A and 13B by lightly applying an external force to the top surface of the p-type GaN layer 5, thereby producing light emitting devices as gallium nitride-based compound semiconductor chips.

The chips produced by the division have slight unevenness only on cross-sectional portions which correspond to the grooves formed by using the scriber in the directions of both grooves 13A and 13B. However, substantially no defects in the shape of the chips, such as nicks or the like, can be found and chips having a satisfactory shape are produced at a high yield.

As described above, when the grooves are formed so as to have the depth and width equal to one another in two mutually orthogonal directions in directions deviated by 15 degrees from two respective cleave facet directions 20 and 30, it is possible to make the ease of division equal in both directions or to make the difference in the ease of division less between the two directions. Therefore, defects, such as nicks in a chip, are substantially not caused.

When the directions in which the grooves are formed deviate within 15±3 degrees from the respective cleave facet directions 20 and 30, defects, such as nicks or the like, are few, thereby producing chips of a satisfactory shape at a high yield.

EXAMPLE 3

In Example 3, the present invention is also applied to a light emitting device, e.g., an LED device.

In the same way as Example 1, as shown in FIG. 1, after an MOCVD growth layer 6 is formed on a top surface of a GaN substrate 1 having a wurtzite type crystal structure and a (0001) facet as a principal facet, a bottom surface of the GaN substrate 1 of a wafer 100 is polished so that the thickness thereof is in the range between 50 µm or more and 250 µm or less, and is most preferably about 80 µm.

As shown in FIG. 3, an n-type electrode 7 is formed on the bottom surface of the GaN substrate 1a of the wafer 100 in an electrode formation process. A p-type transparent electrode 8 is formed on the p-type GaN layer 5 in a prescribed pattern, and then a p-type electrode 9 is formed on the p-type transparent electrode 8 in a prescribed pattern.

Figure 7:
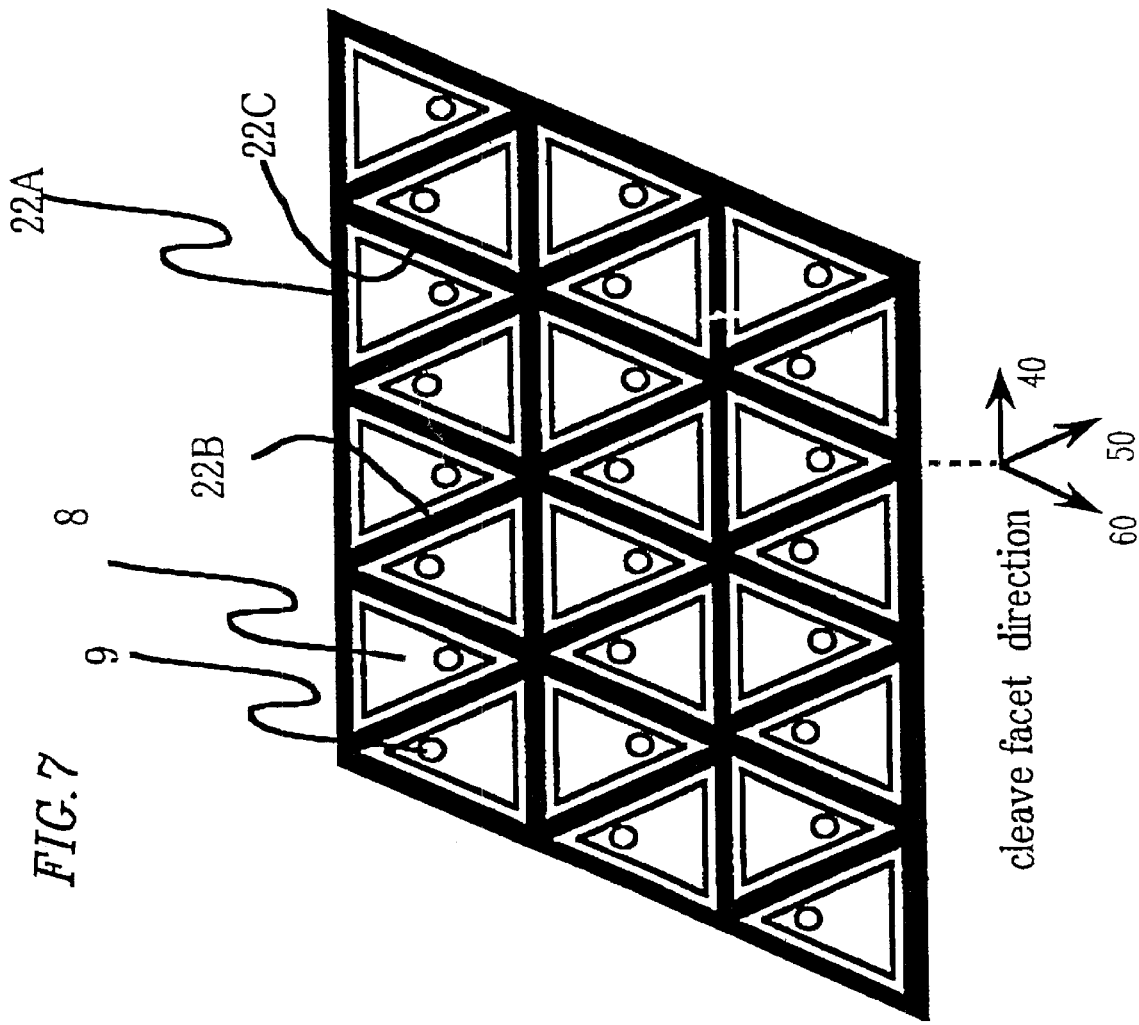
FIG. 7 is a plan view of a wafer for illustrating groove formation directions for the chip division of Example 3 of the present invention.

Next, after putting an adhesive tape on the bottom surface of the wafer 100 so as to cover the n-type electrode 7 for the scribe process, grooves 22A, 22B and 22C, as shown in FIG. 7, are formed by using a scriber on the surface of the p-type GaN layer 5 in the three cleave facet directions 40, 50 and 60 deviated by 60 degrees from one another at a pitch of about 250 µm respectively. The grooves 22A, 22B and 22C are each formed so as to be about 4 µm deep. The wafer is divided along the grooves 22A, 22B and 22C by lightly applying an external force to the top surface of the p-type GaN layer 5, thereby producing light emitting devices as triangular gallium nitride-based compound semiconductor chips.

The chips produced by this deviation have slight unevenness only on cross-sectional portions which correspond to the grooves formed by using the scriber in the directions of the grooves 22A, 22B and 22C. However, substantially no defects in the shape of the chips, such as nicks or the like, can be found and chips having a satisfactory shape are produced at a high yield.

As described above, when the grooves 22A, 22B and 22C are formed at a pitch of about 250 μm in the three directions corresponding to the respective cleave facet directions 40, 50 and 60 of the wurtzite type crystal structures, which deviate by 60 degrees from one another, it is possible to make the ease of division equal in the three directions or to make the difference in the ease of deviation less among the three directions. Therefore, defects, such as nicks in a chip or the like, are substantially not caused.

When the directions in which the grooves are formed deviate within ±3 degrees from the respective cleave facet directions 40, 50 and 60, defects, such as nicks in a chip, are few, thereby producing chips having a satisfactory shape at a high yield.

In the above descriptions, the light emitting devices as triangular chips are produced. However, it is possible to produce light emitting devices as parallelogrammic, rhombic, trapezoidal or hexagonal chips by dividing a wafer in the cleave facet directions. Accordingly, when the grooves are formed along at least two cleave facet directions so that the grooves substantially surround certain regions on the wafer, it is possible that all of the division facets of the gallium nitride-based compound semiconductor chips can be in the cleave facet directions of the gallium nitride substrate, thereby producing chips having a satisfactory shape at a high yield.

EXAMPLE 4

In Example 4, the present invention is also applied to a light emitting device, e.g., an LED device.

As shown in FIG. 1, an n-type GaN substrate 1, about 400 μm in thickness, is formed by a hydride vapor phase epitaxy (HVPE) method or the like. The n-type GaN substrate 1 has a wrutzite type crystal structure and a (0001) facet as a principal facet. A wafer 100 having a light emitting device structure comprises an MOCVD growth layer 6 of a gallium nitride-based compound semiconductor crystal by sequentially laminating, on the gallium nitride substrate 1, an n-type GaN layer 2, 0.5 μm in thickness, a quantum well active layer 3 formed of $In_{(x)}Ga_{(1-x)}N$, a p-type AlGaN layer 4, 30 nm in thickness, and a p-type GaN layer 5, about 0.05 μm in thickness.

A bottom surface of the GaN substrate 1 of the wafer 100 is polished by using a polisher so that the thickness of the wafer 100 becomes about 80 μm.

Figure 8:
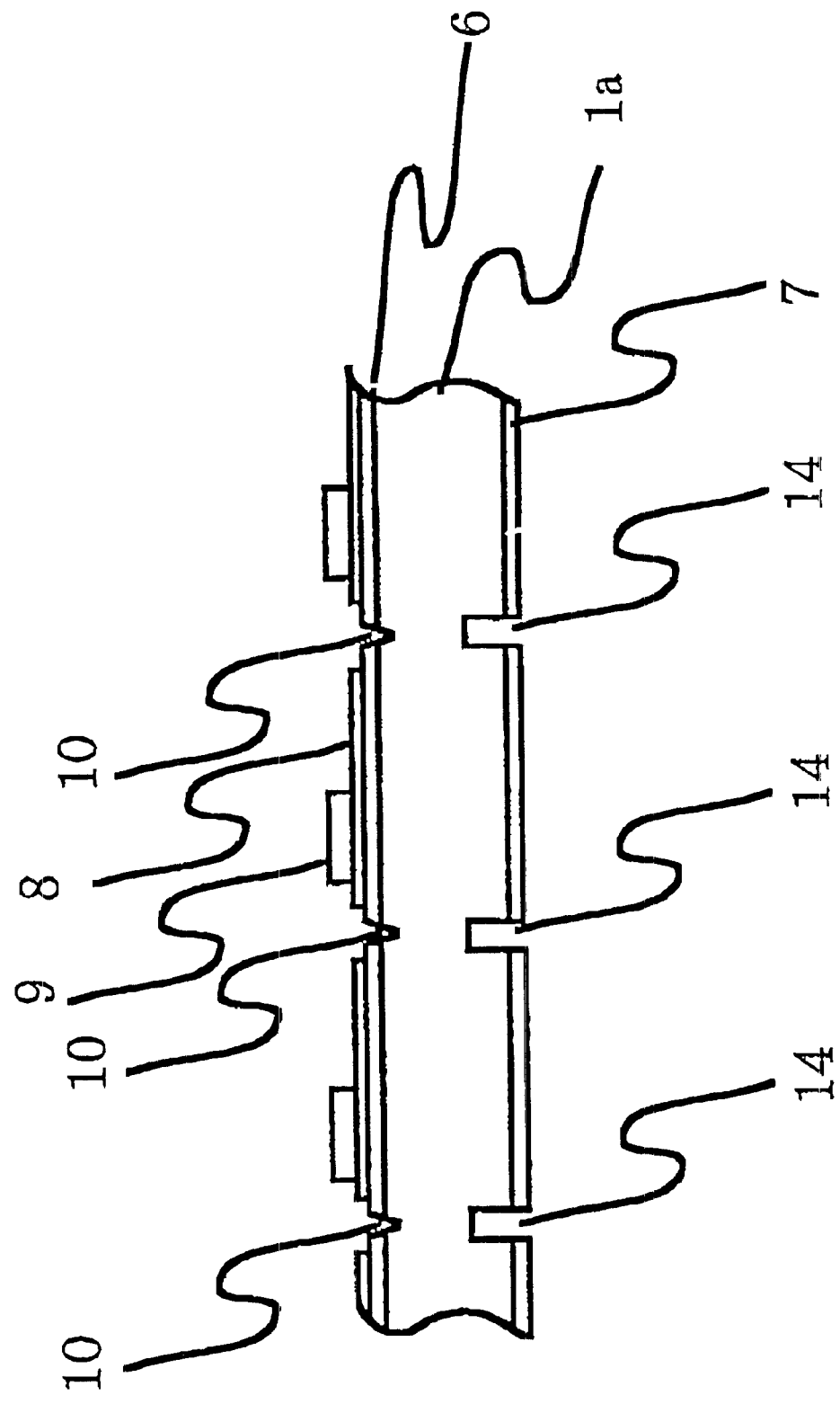
FIG. 8 is a cross-sectional view of a wafer illustrating a groove formation direction for the chip division of Example 4 of the present invention.

As shown in FIG. 2, an n-type electrode 7 is formed on the bottom surface of the GaN substrate 1a of the wafer 100a in an electrode formation process. On the top layer of the MOCVD growth layer 6 including the quantum well active layer 3 (FIG. 1), i.e., on the p-type GaN layer 5, a p-type transparent electrode 8 is formed in a prescribed pattern, and then a p-type electrode 9 is formed on the p-type transparent electrode 8 in a prescribed pattern. Then, as shown in FIG. 8, grooves 14, about 20 μm in depth, are formed by way of etching or dicing in regions on the n-type electrode 7 corresponding to regions on the top surface of the MOCVD growth layer 6 where there is no p-type transparent electrode 8.

Next, after putting an adhesive tape on the surface of the n-type electrode 7 for the scribe process, grooves 10, about 2 μm in depth, are formed by using a scriber in the regions on the top surface of the p-type GaN layer 5, where there is no p-type transparent electrode 8, corresponding to the grooves 14 formed on the surface of the n-type electrode 7.

The grooves 14 and 10 are formed in either of the following directions: (1) the cleave facet direction and a direction substantially perpendicular to the cleave facet direction; (2) two mutually orthogonal directions respectively deviated by 15 degrees from the cleave facet directions; and (3) three cleave facet directions deviated by 60 degrees from one another. The grooves 10 are formed to have the depths as described in Examples 1, 2 and 3. It goes without saying that the p-type transparent electrode 8 is patterned in consideration of the directions of the grooves 10 and 14 to be formed later. Then, the wafer is divided along the grooves 10 and 14 by lightly applying an external force to the top surface of the p type GaN layer 5, thereby producing light emitting devices as gallium nitride-based compound semiconductor chips.

The chips produced by the division have slight unevenness only on cross-sectional portions which correspond to the grooves formed by using the scriber. However, substantially no defect in the shape of the chips, such as nicks or the like, can be found and chips having a satisfactory shape are produced at a high yield.

A high yield chip division can be achieved by making the thickness of the portion to be divided, i.e., the thickness of the remaining layer of the n-type GaN substrate 1a where the grooves 10 and 14 are formed in the range between 50 μm or more and 250 μm or less. In order to achieve this, the thickness to be polished and the depth of the grooves need to be respectively adjusted in the step of polishing the n-type GaN substrate 1 (FIG. 1) and in the step of etching or dicing for forming the grooves 10 and 14.

As described in Example 4, when relatively deep grooves 14 are formed on the surface of the n-type electrode 7, it is possible to improve the ease of the chip division. Therefore, production yield of satisfactory chips is further improved.

Moreover, as described above, the thickness of the remaining layer of the n-type GaN substrate 1a where the grooves are formed may be in the range between 50 μm or more and 250 μm or less. Accordingly, the thickness of the GaN substrate 1a in regions where there is no groove may be as thick as 400 μm at the maximum. By keeping the GaN substrate 1 relatively thick, the generation of the defects in the polishing process is substantially suppressed, thereby improving the light emission efficiency.

EXAMPLE 5

In Example 5, the present invention is also applied to a light emitting device, e.g., an LED device.

Figure 9:
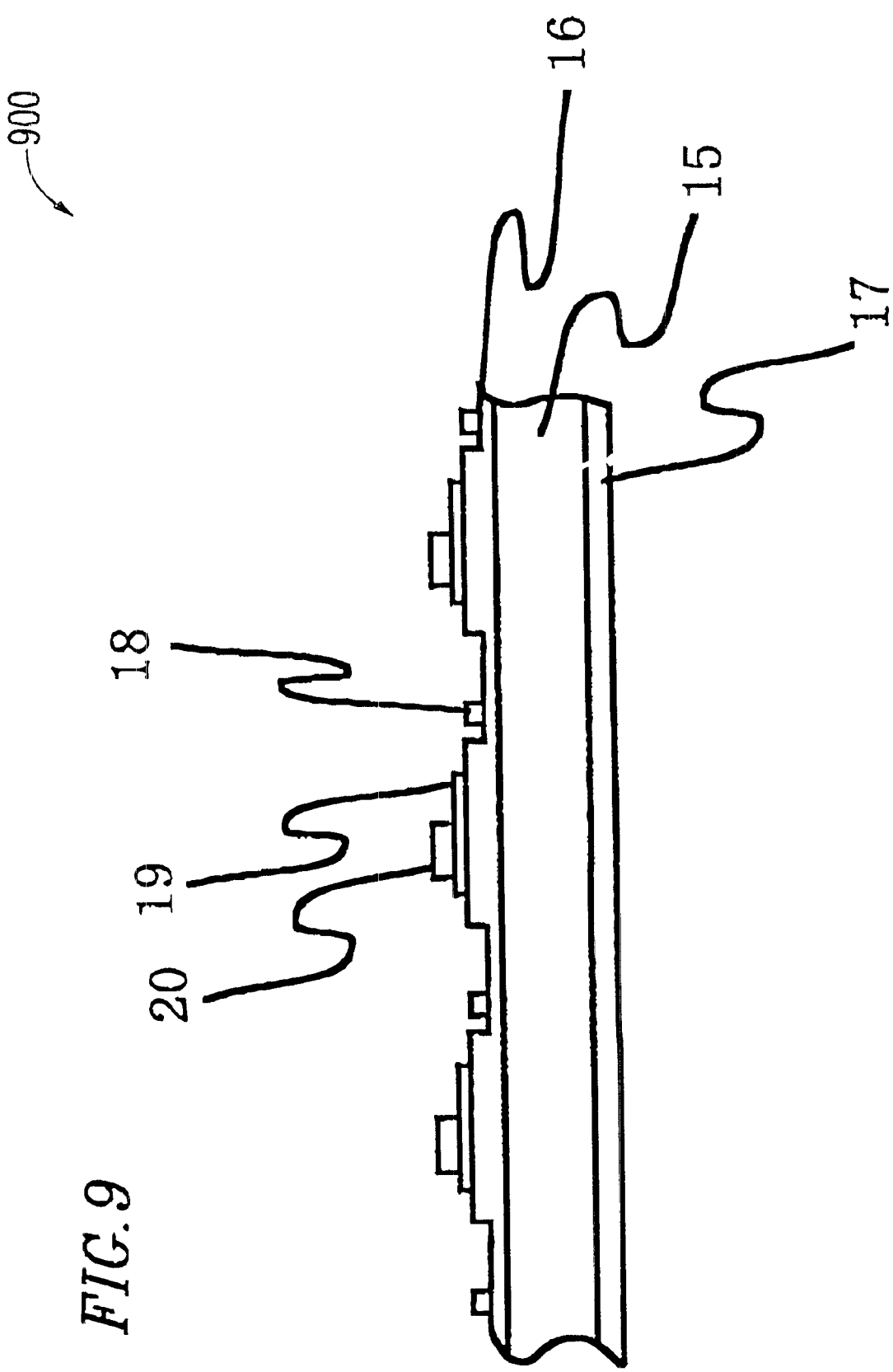
FIG. 9 is a cross-sectional view of a wafer illustrating a groove formation direction for the chip division of Example 5 of the present invention.

FIG. 9 shows a cross-sectional view of a wafer 900 including a gallium nitride substrate and a gallium nitride-based compound semiconductor structure formed thereon. The wafer 900 is formed as follows. An n-type GaN layer 15, about 80 μm in thickness, having a wurtzite crystal structure is formed on a (0001) facet of a sapphire substrate 17, about 400 μm in thickness by a hydride vapor phase epitaxy (HVPE) method. On the n-type GaN layer 15, an MOCVD growth layer 16 of a gallium nitride-based compound semiconductor crystal is formed by using a metal organic chemical vapor deposition (MOCVD) method by sequentially laminating an n-type GaN layer, about 0.5 μm in thickness, a quantum well active layer formed of $In_{(x)}Ga_{(1-x)}N$, a p-type AlGaN layer, 30 nm in thickness, and a p-type GaN layer, about 0.05 μm in thickness. The quantum well active layer may be a semiconductor layer including phosphorus or arsenic instead of nitrogen as a group V element. A part of the p-type layer is removed by way of etching to partially expose the n-type GaN layer and then an n-type electrode 18, a p-type transparent electrode 19 and a p-type electrode pad 20 in a prescribed pattern are formed thereon. The sapphire substrate 17 is polished by using a polisher so that the thickness of the wafer 900 becomes 100 μm.

Figure 10:
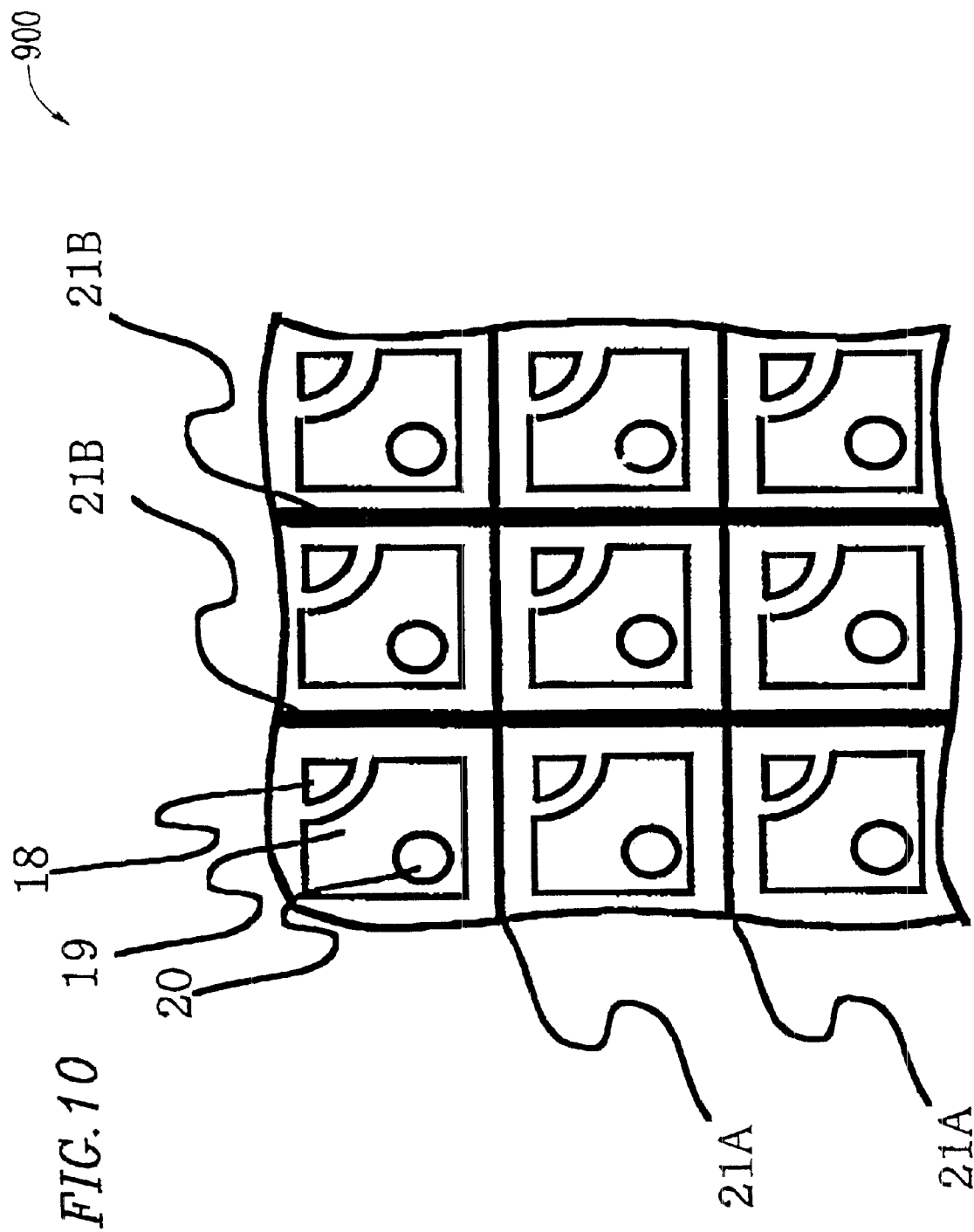
FIG. 10 is a plan view of a wafer illustrating a production step of Example 5 of the present invention.

Then, after putting an adhesive tape on the sapphire substrate 17 for the scribe process shown in FIG. 10, grooves 21A and 21B are formed by using a scriber on a top surface of the exposed n-type GaN layer in two mutually orthogonal directions. (The grooves may be formed on the top surface of the wafer 900 including the sapphire substrate 17 in either of the following directions: (1) the cleave facet direction and a direction substantially perpendicular to the cleave direction; (2) two mutually orthogonal directions respectively deviated by 15 degrees from the cleave facet directions; and (3) three cleave facet directions deviated by 60 degrees from one another. The grooves are formed to have the depths as described in Examples 1 and 2.) It goes without saying that the p-type transparent electrodes 8 is patterned in consideration of the directions of the grooves 21A and 21B to be formed later. Then, the wafer is divided into chips along the grooves 21A and 21B by lightly applying an external force to the top surface of the p-type GaN layer 5, thereby producing light emitting devices as gallium nitride-based compound semiconductor chips.

In Example 5, the thickness of the remaining sapphire substrate 17 is as thin as 20 μm and the most part of the wafer is the n-type GaN-based compound semiconductor crystal having a wurtzite type crystal structure. Therefore, the remaining sapphire substrate 17 does not affect the wafer and substantially no defects in the shape of the chips, such as nicks or the like, can be found and satisfactory chips of light emitting devices are produced at a high yield.

Example 5 corresponds to a structure where a thin sapphire substrate is provided under the gallium nitride substrate of Examples 1 to 3.

In Example 5, the n-type GaN layer having a wurtzite type crystal structure, about 80 μm in thickness, is grown by an HVPE method on the sapphire substrate, about 400 μm in thickness, and the bottom surface of the wafer is polished by using the polisher so that the thickness of the wafer becomes about 100 μm after the GaN-based compound semiconductor layer is grown by an MOCVD method. It is sufficient that the thickness of the n-type GaN layer grown by the HVPE method is in the range between 50 μm or more and 250 μm or less, and in the polishing process, it is sufficient that the thickness of the remaining sapphire substrate is less than that of the n-type GaN layer grown by the HVPE method, so as to avoid the aforementioned conventional problems of generation of defects in the chip shape.

In Examples 1 through 5 described above, the grooves on the growth surface are formed by using a scriber. However, a dicer or etching technique can be used instead of using the scriber. In the case of using a wet etching technique, for example, a mixed acid of sulfuric acid and phosphoric acid can be used. In the case of using a dry etching technique, a method such as reactive ion etching, ion milling, focused ion beam etching, ECR etching, etc., can be used.

EXAMPLE 6

Figure 13:
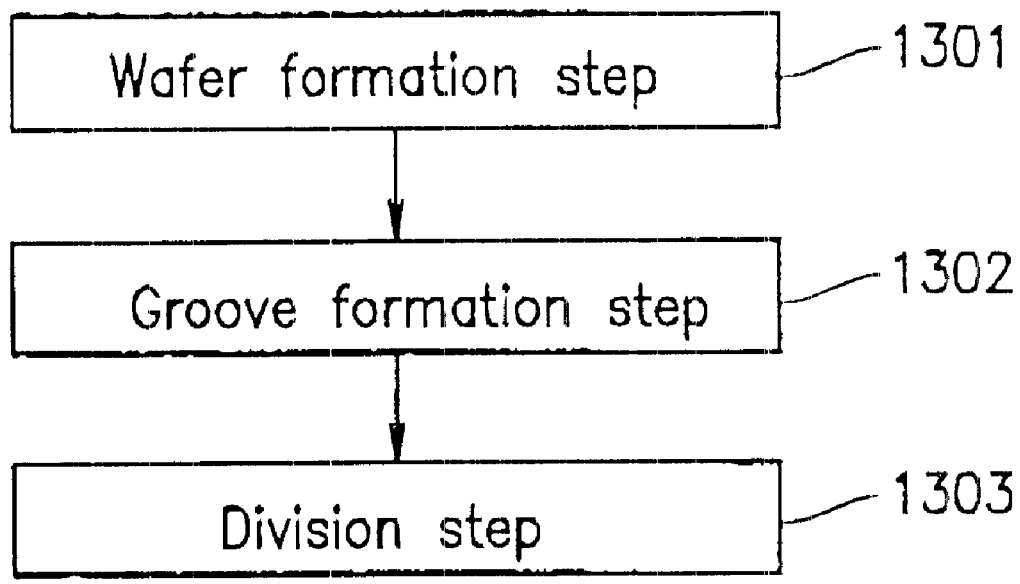
FIG. 13 is a flow chart illustrating the production steps of the present invention.

The above described methods for producing the gallium nitride-based compound semiconductor chips are described in Example 6 by referring to FIG. 13. In step 1301 of FIG. 13, a wafer is formed by growing the gallium nitride-based compound semiconductor crystal on the gallium nitride substrate where a (0001) facet of the wurtzite type crystal structure is a principal facet. In this step, when the gallium nitride substrate is formed so as to make the thickness thereof in the range between 50 μm or more and 250 μm or less, the gallium nitride-based compound semiconductor chips are produced at a satisfactory yield.

In step 1302, grooves for dividing the wafer into chips are formed. The grooves are formed in the cleave facet direction of the gallium nitride substrate, thereby making the division easily. The grooves may be formed in a direction substantially perpendicular to the cleave facet direction as well as the cleave facet direction in order to form square or rectangular chips. In this case, the length of the grooves corresponding to a single chip formed in the cleave facet direction of the gallium nitride substrate may be longer than the length of the grooves corresponding to a single chip formed in the direction substantially perpendicular to the cleave facet direction of the gallium nitride substrate. As a result, the grooves in a direction of the shorter side of the chips, where a greater force is applied, are formed in a direction substantially perpendicular to the cleave facet direction (i.e., in a direction along which the division is not easily made), and the grooves in a direction of the longer side of the chips are formed in the cleave facet direction (i.e., in a direction along which the division is made more easily). Therefore, the grooves substantially surround rectangular regions on the wafer and thus it is possible to apply an appropriate force to the grooves because of leverage. Therefore, the chips are produced at a higher yield.

As described in Example 2, the grooves may be formed in the orthogonal directions respectively deviated by 15 degrees from the cleave facet directions.

As described in Example 4, the grooves are formed on both surfaces of the wafer so that the grooves on one surface positionally correspond to those on the other surface.

The grooves are formed along at least two cleave facet directions of the gallium nitride substrate so that the grooves substantially surround certain regions on the wafer. Therefore, all of the division facets of the gallium nitride-based compound semiconductor chips obtained by dividing the wafer are in the cleave facet directions of the gallium nitride substrate, thereby making chip division relatively easy.

In step 1303, the wafer is divided into chips along the grooves thereon, thereby producing the gallium nitride-based compound semiconductor chips.

According to the present invention, gallium nitride-based compound semiconductor chips formed as a result of dividing a wafer including a gallium nitride-based compound semiconductor crystal grown on the gallium nitride substrate with a wurtzite type crystal structure are provided. By appropriately adjusting the directions and the depth of the grooves along which the wafer is divided, the ease of chip division is made equal or the difference in the ease of chip division is made less between two or more directions of the grooves. Therefore, substantially no defects, such as nicks in a chip, are caused and the gallium nitride-based compound semiconductor chips as the light emitting devices are produced at a high yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride-based compound semiconductor chip, comprising:

a gallium nitride substrate having a (0001) facet of a wurtzite type crystal structure as a principal facet; and a gallium nitride-based compound semiconductor crystal formed on the gallium nitride substrate, wherein:

the gallium nitride-based compound semiconductor chip has a plurality of division facets;

at least one of the plurality of division facets is in a cleave facet direction of the gallium nitride substrate; and at least one other of the plurality of division facets in a direction substantially perpendicular to the cleave facet direction of the gallium nitride substrate.

2. A gallium nitride-based compound semiconductor chip according to claim 1, wherein a thickness of the gallium nitride substrate is in the range from 50 μm to 250 μm.

3. A gallium nitride-based compound semiconductor chip according to claim 1, wherein a side length of the at least one division facet in the cleave facet direction of the gallium nitride substrate is longer than a side length of the at least one division facet, in a direction substantially perpendicular to the cleave facet direction of the gallium nitride substrate.

4. A gallium nitride-based compound semiconductor chip according to claim 1, wherein all of the plurality of division facets of the gallium nitride-based compound semiconductor chip are in the cleave facet directions of the gallium nitride substrate.

5. A gallium nitride-based compound semiconductor chip, comprising:

a gallium nitride substrate with a (0001) facet of a wurtzite type crystal structure as a principal facet; and a gallium nitride-based compound semiconductor crystal formed on the gallium nitride substrate, wherein at least two of a plurality of division facets of the gallium nitride-based compound semiconductor chip deviate by 15 degrees from a cleave facet of the gallium nitride substrate, and are formed in directions substantially perpendicular to each other.

6. A gallium nitride-based compound semiconductor chip according to claim 5, wherein a thickness of the gallium nitride substrate is in the range from 50 μm to 250 μm.

7. A gallium nitride-based compound semiconductor chip produced by a method comprising:

a wafer formation step of forming a wafer having a gallium nitride-based compound semiconductor crystal grown on a gallium nitride substrate with a (0001) facet of a wurtzite type crystal structure as a principal facet so that a thickness of the gallium nitride substrate is in the range from 50 μm to 250 μm;

a groove formation step of forming grooves on the wafer for a chip division; and a division step of dividing the wafer into gallium nitride-based compound semiconductor chips.

8. A gallium nitride-based compound semiconductor chip produced by a method comprising:

a wafer formation step of forming a wafer having a gallium nitride-based compound semiconductor crystal grown on a gallium nitride substrate with a (0001) facet of a wurtzite type crystal structure as a principal facet;

a groove formation step of forming grooves in a cleave facet direction of the gallium nitride substrate; and a division step of dividing the wafer into gallium nitride-based compound semiconductor chips.

9. A gallium nitride-based compound semiconductor chip produced by a method comprising:

a wafer formation step of forming a wafer having a gallium nitride-based compound semiconductor crystal grown on a gallium nitride substrate with a (0001) facet of a wurtzite type crystal structure as a principal facet;

a groove formation step of forming grooves in directions substantially perpendicular to each other so that each of the direction of the grooves deviates by 15 degrees from a cleave facet direction of the gallium nitride substrate; and a division step of dividing the wafer into gallium nitride-based compound semiconductor chips.

10. A gallium nitride-based compound semiconductor wafer, comprising:

a gallium nitride substrate with a (0001) facet of a wurtzite type crystal structure as a principal facet; and a gallium nitride-based compound semiconductor crystal grown on the gallium nitride substrate;

wherein grooves are formed on a surface of the gallium nitride-based compound semiconductor wafer at least in a cleave facet direction of the gallium nitride substrate.

11. A gallium nitride-based compound semiconductor wafer according to claim 10, wherein the grooves are formed on the surface of the gallium nitride-based compound semiconductor wafer in a direction substantially perpendicular to the cleave facet direction of the gallium nitride substrate.

12. A gallium nitride-based compound semiconductor wafer according to claim 11, wherein a depth of the grooves substantially perpendicular to the cleave facet direction of the gallium nitride substrate is greater than a depth of the grooves in the cleave facet direction of the gallium nitride substrate.

13. A gallium nitride-based compound semiconductor wafer according to claim 10, wherein the grooves are formed on the gallium nitride-based compound semiconductor crystal.

14. A gallium nitride-based compound semiconductor wafer according to claim 10, wherein all of the grooves are formed in the cleave facet direction of the gallium nitride substrate.

15. A gallium nitride-based compound semiconductor wafer according to claim 10, wherein grooves are formed on one surface and further grooves are formed on a surface opposite from said one surface so as to correspond to the grooves formed thereon.

16. A gallium nitride-based compound semiconductor wafer, comprising:

a gallium nitride substrate with a (0001) facet of a wurtzite type crystal structure as a principal facet; and a gallium nitride-based compound semiconductor crystal formed on the gallium nitride substrate, wherein grooves are formed on a surface of the gallium nitride-based compound semiconductor wafer in directions substantially perpendicular to each other so that each of the directions of the grooves deviates by 15 degrees from a cleave facet direction of the gallium nitride substrate.

* * * * *